United States Patent [19]

Kayanakis

[11] Patent Number: 4,982,069

[45] Date of Patent: Jan. 1, 1991

[54] DATA PROCESSING SYSTEM FOR SMART CARDS HAVING A PLURALITY OF ELECTRONIC MODULES

[75] Inventor: Georges Kayanakis, Ville d'Avray, France

[73] Assignee: Schlumberger Industries, S.A., Montrouge, France

[21] Appl. No.: 98,646

[22] Filed: Sep. 21, 1987

[30] Foreign Application Priority Data

Sep. 22, 1986 [FR] France .................................. 86 13209

[51] Int. Cl.[5] ............................................. G06K 19/00
[52] U.S. Cl. .................................... 235/375; 235/487; 235/441
[58] Field of Search ................. 235/375, 379, 380, 487, 235/493, 495, 435, 439, 441

[56] References Cited

U.S. PATENT DOCUMENTS

| | | | |
|---|---|---|---|
| 4,041,279 | 8/1977 | Foote | 235/440 |
| 4,450,348 | 5/1984 | Stockburger et al. | 235/487 |
| 4,542,528 | 9/1985 | Sanner et al. | 235/440 |
| 4,628,195 | 12/1986 | Baos | 235/440 |
| 4,697,073 | 9/1987 | Hara | 235/487 |

*Primary Examiner*—Philip H. Leung
*Assistant Examiner*—Jeffrey A. Gaffin
*Attorney, Agent, or Firm*—Frishauf, Holtz, Goodman & Woodward

[57] ABSTRACT

A data processing system is described. The system includes a smart card having at least two independent electronic modules. A way to connect the multiple electronic modules through the use of the reader is also disclosed. By using circuitry in the reader to perform the interconnection function, the overall complexity of the electronic functions on the card can be increased without increasing either the size of the individual integrated circuits or the difficulty of fitting them into a smart card.

4 Claims, 2 Drawing Sheets

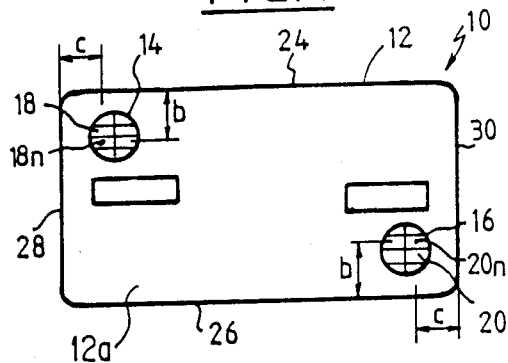
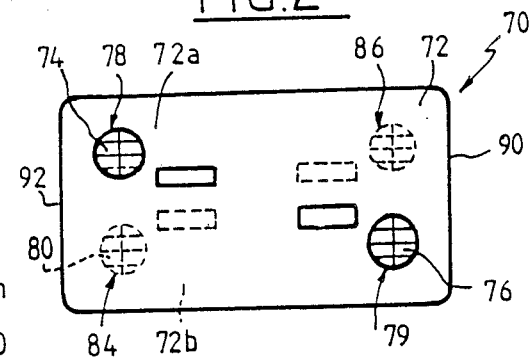
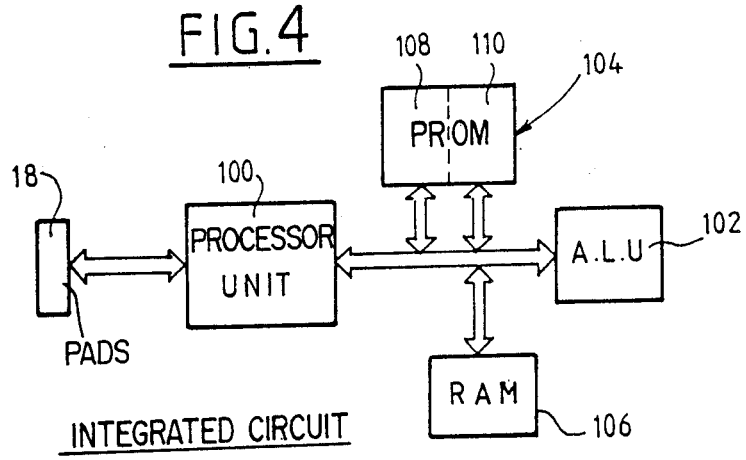

4,982,069

DATA PROCESSING SYSTEM FOR SMART CARDS HAVING A PLURALITY OF ELECTRONIC MODULES

The present invention relates to a data processing system for smart cards having a plurality of electronic modules.

Smart cards, i.e. cards including electronic memory are giving users access to more and more goods and services, or to locations having access control systems that use such cards.

BACKGROUND OF THE INVENTION

Before describing such systems in greater detail, it is important to recall what known electronic memory cards consist of. The card comprises a body of plastic material having an electronic module implanted therein, the module comprising a semiconductor chip having an integrated circuit formed thereon together with contact tabs which are disposed on one of the main faces of the card body and which are electrically connected to the terminals of the integrated circuit. The card must have standardized dimensions, and in particular its thickness must be less than one millimeter and the contact tabs must be in specified positions relative to the edges of the card. In addition, the card together with its electronic module must satisfy mechanical tests, and in particular bending tests, in order to ensure that the electronic module will not come unstuck from the body of the card. Given the thinness of the card body, numerous problems are encountered in implanting the electronic module in the body. In particular, the hollows required for receiving the electronic module must be provided with precision, in particular relating to the location of the hollow relative to the outside edges of the card body. In addition, implanting an electronic module in a card body requires a certain number of operations to be performed which must be repeated when manufacturing each card.

It will be understood that the cost of manufacturing a card body and fixing an electronic module in the card body is by no means negligible. In contrast, for a given architecture, the cost of manufacturing an integrated circuit tends to fall off significantly. Consequently, in the overall manufacturing cost of an electronic memory card, the fraction due to manufacturing the body of the card and to implanting the electronic module tends to increase considerably. As a result, within a given organization the solution which consists in providing one card for each function considerably increases the fixed cost which is specifically related to manufacturing the cards. The smaller the amount of money's worth stored in the card, the less the user is prepared to accept this fixed cost.

It is also disagreeable for a user to have to keep on the person a plurality of different cards for obtaining different commonly used services.

The other solution which consists in providing a single card for giving access to different services requires an integrated circuit of much more complicated architecture in order to enable a single circuit to provide different functions. This implies an integrated circuit including wired logic structure or microprocessor structure together with large memory capacity. As a result, the integrated circuit will be considerably more expensive and the area of the semiconductor chip will be considerably larger. The first point means that the number of different functions must be very small, and the second point naturally makes implanting the electronic module in the card more difficult.

Further, if the number of available services increases, or if access to data handling networks needs to be better protected, the authorization or authentification procedures of the card and/or the card-bearer must be reinforced without inconveniencing the user, i.e. without making the operations which the user must perform to gain access to services or to a data network more complex.

An aim of the invention is to provide a data processing system for smart cards having a plurality of electronic modules and avoiding the above-mentioned drawbacks.

Before describing the invention, it is appropriate to specify what is meant in the present text by the term "card processing device".

"Card processing device" means a device into which a smart card (i.e. one including electronic memory) may be inserted and which is capable of reading the data stored in the card, of writing new data into the card and also of processing the data read together with data coming from elsewhere in order to authorize access to a service or to a data network. As is well known, another function of the processing device is to provide the integrated circuit of the card with its electrical power supply since cards do not, in general, include their own power supply.

SUMMARY OF THE INVENTION

According to the invention, this aim is achieved by providing a data processing system for memory cards including a plurality of electronic modules, the system comprising a plurality of memory cards and at least one processing device for said cards, the system including the improvement whereby each card comprises a body having a first main face and a second main face substantially parallel to said first face, and at least two electronic modules each of which comprises a semiconductor chip constituting an integrated circuit, a plurality of contact tabs, and means for electrically connecting said tabs to the terminals of said chip, each electronic module being received in a cavity provided in said card body so that said contact tabs are disposed substantially in the plane of one of the main faces of the card body, and wherein the processing device comprises means for guiding said card to a processing position, an assembly for processing the data in said integrated circuits in the card and for feeding electrical power thereto, and at least two read/write heads for providing simultaneous electrical connection between said sets of electrical contact tabs of said electronic modules and said processing and power supply assembly when said card is in the processing position.

It can thus be understood that full operation of the card makes use not only of data or instructions stored in the card processing device, but also of data and/or instructions contained in a least one of the integrated circuits. Such a system is thus much more difficult to operate fraudulently than a prior system having only one integrated circuit or having two integrated circuits which are interconnected in the card itself.

BRIEF DESCRIPTION OF THE DRAWINGS

Other characteristics and advantages of the invention appear more clearly on reading the following description of various embodiments of the invention given by way of non-limiting example. The description refers to the accompanying drawings, in which:

FIG. 1 is a plan view of an electronic memory card including two distinct electronic modules;

FIG. 2 is a plan view of an electronic memory card including four distinct electronic modules;

FIG. 4 show the structure of an integrated circuit provided in one of the of the electronic modules in order to encode data.

MORE DETAILED DESCRIPTION

Figure 3A:
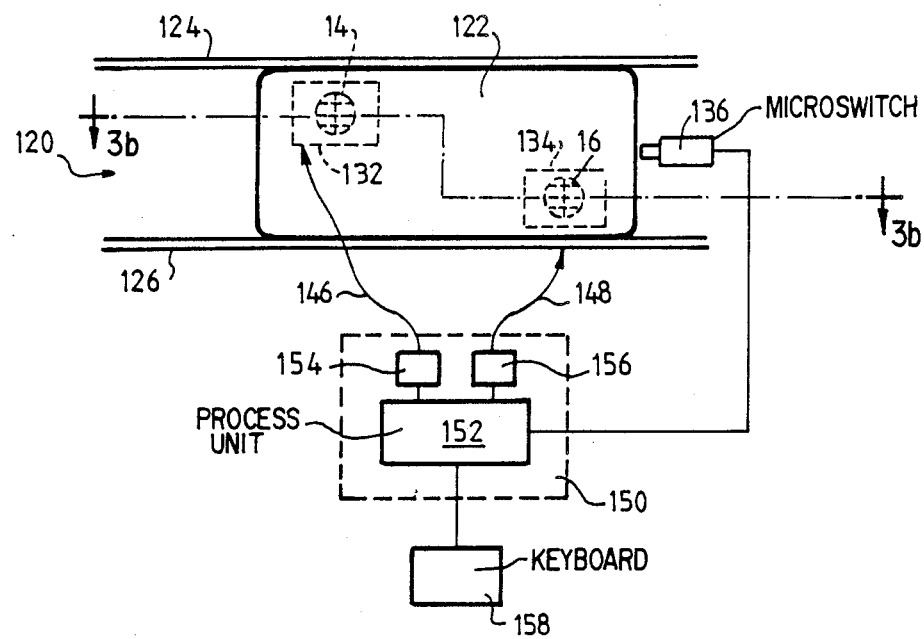
FIGS. 3a and 3b are respectively a plan view and a vertical section on 3a—3b in FIG. 3a through an embodiment of a card reader in accordance with the invention.

FIG. 1 shows a first embodiment of an electronic memory card. The card 10 comprises a body 12 which is generally in the shape of a rectangular parallelipiped. The body 12 is preferably made of a thermoplastic material such as PVC. The thickness of the body is standardized and is less than 1 mm.

The card also comprises two electronic modules 14 and 16 for which only the sets of electrical contact tabs 18 and 20 are visible.

Each electronic module 14, 16 may be made in various different ways prior to being implanted in the body of the card. An electronic module always includes a semiconductor chip having an integrated circuit made thereon, which circuit includes a portion constituting the memory, together with electrical connections connecting the terminals of the semi-conductor chip to the electric contact tabs 18, 20. The electronic modules 14 and 16 are implanted in the card body in such a manner that the electric contact tabs are substantially at the same level as the top main face 12a of the card body.

European patent application No. 128.822 filed June 6, 1984 in the name of Flonic shows various ways of making an electronic module and various ways of implanting the electronic module in the card body. However, other forms of electronic module or other methods of implantation could naturally be used without going beyond the scope of the invention.

Preferably, the sets of electrical contact tabs are disposed in such a manner that a contact tab 18n of electronic module 14 and the corresponding contact tab 20n of module 16 are both at the same distance b from a respective one of the long sides 24 and 26, and at the same distance c from a respective one of the short sides 28 and 30.

FIG. 2 shows a second embodiment of an electronic memory card having four electronic modules 78, 79, 84, and 86 in accordance with the invention. The card 70 comprises a body 72 having exactly the same characteristics as the body 12 of the card 10. The first main face 72a of the card (visible in FIG. 2), includes two sets of electrical contact tabs 74 and 76 constituting parts of two electronic modules 78 and 79. The sets of contact tabs 74 and 76 are disposed in the face 72a of the card 70 in exactly the same way as the sets of contact tabs 18 and 20 are disposed in the face 12a of the card in FIG. 1. The second face 72b of the card also includes two sets of contact tabs 80 and 82 which constitute respective portions of two other electronic modules 84 and 86.

Preferably, when looking at the face 72b of the card, the sets of contact tabs 80 and 82 occupy exactly the same positions as the sets 74 and 76 in the face 72a.

A card reader in accordance with the invention for operating with a card of the type shown in FIG. 1 is described with reference to FIGS. 3a and 3b. In this example, the integrated circuit of electronic module 14 serves to encode and decode data while the electronic module 16 serves solely for storing coded data.

As shown in FIG. 4, the integrated circuit of the module 14 essentially comprises a processor unit 100, an arithmetic and logic unit 102, a first memory 104 for fixed data and program, e.g. a PROM, and a second or working memory 106, e.g. RAM. The first memory includes a first protected zone 108 which is inaccessible from the exterior both in writing and in reading, and a second zone 110 which is accessible from the exterior for writing and for reading. The contact tabs 18 are directly connected to the processor unit 100 in such a manner as to ensure that the processor unit 100 has full control over the operation of the integrated circuit. The protected memory zone 108 contains, in particular, parameters for encoding and decoding data to be transcoded. The program memory 104 also contains the instructions necessary for running the encoding and decoding algorithms which make use of the arithmetic and logic unit 102. There coding systems are well known. They may implement an RSA code or a DES code, for example.

The second electronic module 16 is constituted solely by a programmable non-volatile memory and by its read-write circuit. Since the semiconductor chip comprises memory only, the memory capacity maybe large.

Figure 3B:
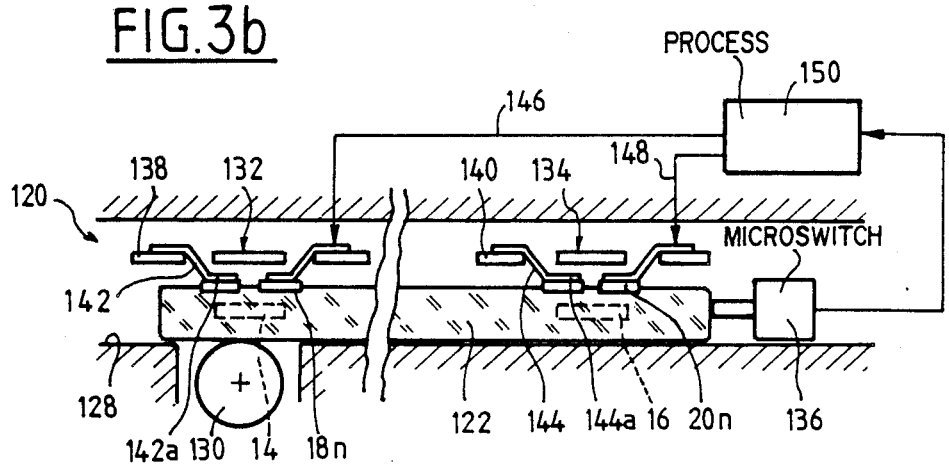

FIGS. 3a and 3b show a device for processing electronic memory cards and suitable for use with the card described above with reference to FIG. 4. The device includes a passage 120 into which the card 122 is inserted. The passage is limited sideways by guide walls 124 and 126, and downwards by a floor 128. FIG. 3b shows, in simplified manner, a wheel 130 for driving the card 122 into the read position, and for ejecting the card from the passage after it has been processed.

The read/write device also includes two read/write heads 132 and 134 which are disposed in the insertion passage 120 in such a manner as to come into contact with the set of contact tabs 18 and 20 respectively of the electronic modules 14 and 16 in the card 122, whenever the card is in the processing position. The arrival of the card 122 in the processing position is detected by an electrical microswitch 136. Each head 132 and 134 includes an insulating support 138 or 140 having contact blades 142 or 144 fixed thereto. The ends 142a and 144a of the contact blades 142 and 144 are disposed in the same geometrical configuration as the contact tabs 18n and 20n. The contact blades 142 and 144 are connected by conductors such as 146 and 148 to a processor assembly 150 in the read-write device. The processor assembly also receives the signal delivered by the microswitch 136 when the card 122 is in the processing position.

The processing assembly 150 comprises a processing unit 152, and a read-write circuit 154 associated to the read-write head 132 and the read-write head 134. The processing assembly 150 also provides electrical power to the integrated circuits of the electronic modules 14 and 16. The card processing device finally includes a data input means 158 constituted, for example, by a numeric or an alphanumeric keyboard. The data likely to be input may comprise, for example, the personal identification number of the card holder together with the amount of the transaction which the card holder wishes to perform.

As explained above, when the card is in the processing position in the insertion passage 120, as detected by the microswitch 136, the contact tabs of the two electronic modules are in electrical connection with the conducting blades 142 and 144 of the two read/write heads 132 and 134. Consequently, both of the electronic module integrated are powered with electricity and the processing unit 150 is capable of operating simultaneously with both of the integrated circuits.

The dialog between the memory card processing device and the two integrated circuits on the card takes place differently depending on the nature of the operation to be performed. However, general rules can be specified for-the application described with reference to FIGS. 3a and 3b.

All the data stored in memory module 16 is written in the memory in coded from. Data in the clear, as input form the keyboard 158 or as directly generated by the processing unit 150 is initially sent via write head 132 to the integrated circuit in module 14. This circuit implements the coding algorithm contained in its memory 104. The coded data is returned to the processing assembly 150 in the processing device and is then written in the memory of the module 16 via the read/write head 134.

The coded information may also be initially processed by the circuit 14. This happens when the data keyed in is the personal identification number of the card bearer. The already encoded identification number is read in the memory of the circuit 16 and is temporarily written into the memory of the circuit 14. The coded identification number is decoded in this circuit using the inverse algorithm and it is compared with the identification number input in the clear by the card bearer by means of the keyboard 158. The two identification numbers are compared. If they are identical, the circuit 14 delivers an authorization signal to the processing assembly 150 to enable the subsequent operations required for providing the desired service to be performed.

It will be understood that the circuit in module 16 containing the non-volatile memory has no need for circuits providing read or write access protection. All of the data stored therein is stored in encoded form. There is therefore no point in a fraudulent user reading this data. Similarly, fraudulent modification of the data written therein can only have the effect of making the card unusable This is because decoding the modified data would give rise to unknown data in the clear which data is therefore unusable for obtaining a service. The entire area of the semiconductor in electronic module 16 can therefore be used for providing a non-volatile memory.

The above-described system may also be used for controlling access to a data network. The circuit 14 similarly contains a coding algorithm and identification data. The memory in the circuit 16 may be used, for example, to record times at which access has been authorized.

Naturally, this way of using two electronic modules in a card simultaneously could be applied to modules disposed in two corners of the same face of the card body and lying on the same long side thereof. In this case, the two read/write heads of the card processing device would be in alignment along the card insertion direction.

It is also possible to use cards of the type shown in FIG. 2. Such cards can be used to implement two distinct functions depending on the way in which the card is inserted into the reader, and more precisely depending on which face of the card body is directed towards the read heads.

According to an other embodiment of the invention the first electronic module 14 can include only a processing unit Without memory. The processing circuit is designed so that it is able to treat the data applied to the inputs 1/outputs 18 and to deliver processed data at the inputs/outputs 18.

According to still an other embodiment of the invention the first electronic module 14 can include a processing unit and s working memory such as a RAM. Alternatively the integrated circuit can further includes a ROM (read only memory). Initially the ROM is loaded with program instructions corresponding to the programs to the implemented by the processing unit.

According to a further embodiment of the invention the second electronic module 16 can also have the architecture shown in FIG. 4. As a result the data stored in the card have been processed by the circuits of the card processing unit and by the two processing units of the electronic modules.

I claim:

1. A data processing system comprising:
   (a) at least one memory card including, a body having a first and a second main face, and at least two electronic modules, each electronic module being received in a cavity provided in said card body and comprising a semiconductor chip constituting an integrated circuit, each said integrated circuit having terminals, a set of external contact tabs disposed in said main faces of the card body, and means for electrically connecting said terminals to said external contact tabs, at least one of said integrated circuits including a non-volatile memory, at least one of said integrated circuits including a processing unit, and at least one of said integrated circuits storing data; and
   (b) at least one processing device comprising:
      (i) means for processing data stored in said integrated circuits of said card and for supplying electrical power thereto; and
      (ii) at least two read/write heads for providing simultaneous electrical connections between said processing unit and a power supply means and said at least two sets of external contact tabs when said card is in a processing position within said processing device.

2. A system according to claim 1, wherein said memory means of the card is comprised of a programmable non-volatile memory.

3. A system according to claim 1, wherein each card includes four electronic modules, each electronic module comprising a semiconductor chip comprising an integrated circuit, a plurality of contact tabs, and means for interconnecting said contact tabs to the terminals of said chip; and wherein each processing device includes two read/write heads for providing simultaneous electrical connection between the contact tabs of two of the four electronic modules and the processing assembly of the processing devices; the two electronic modules which are simultaneously connected to said processing assembly being defined by the way in which the card is inserted into the guiding means of the processing device.

4. A data processing system comprising:
   (a) at least one memory card including a body having a first main face and a second main face and a first electronic module and a second electronic module, each of said electronic modules being received in a particular cavity provided in said card body and comprising:
- (i) a semiconductor chip constituting an integrated circuit, said chip having terminals;
- (ii) a set of contact tabs disposed in said first main face of the card body; and
- (iii) means for electrically connecting each of said terminals to one of said external tabs; said first integrated circuit including a programmable non-volatile memory, said second integrated circuit including a processing unit and means for storing data; and (b) at least one processing device comprising:
- (i) means for guiding said card to a processing position;
- (ii) two read-write heads, each head including a set of contact blade means for each external tab of a set being in electrical contact with the external tabs of the corresponding set of external tabs when said card is in said processing position;
- (iii) processing and power supply means;
- (v) means for interconnecting said processing and power supply means to said contact blade means of said two read/write heads; and
- (vi) means for introducing into said processing means external data;

said processing unit being adapted to process data received from said processing device as a function of said data stored in said storing means, to transfer from said first chip to said processing means said processed data; and to transfer to said second chip said processed and data store them into said programmable non volatile memory.

* * * * *